United States Patent
Zhang et al.

(10) Patent No.: US 11,829,695 B2
(45) Date of Patent: Nov. 28, 2023

(54) METHOD AND SYSTEM FOR LOGIC DESIGN PARTITIONING

(71) Applicant: S2C Limited, Shanghai (CN)

(72) Inventors: Jifeng Zhang, Shanghai (CN); Chuan Li, Shanghai (CN)

(73) Assignee: S2C LIMITED, Shanghai (CN)

( * ) Notice: Subject to any disclaimer, the term of this patent is extended or adjusted under 35 U.S.C. 154(b) by 187 days.

(21) Appl. No.: 17/402,632

(22) Filed: Aug. 16, 2021

(65) Prior Publication Data
US 2022/0198116 A1    Jun. 23, 2022

(30) Foreign Application Priority Data

Dec. 21, 2020 (CN) .......................... 202011513538.4

(51) Int. Cl.
*G06F 30/34* (2020.01)
*G06F 30/392* (2020.01)
*G06F 30/3312* (2020.01)
*G06F 30/327* (2020.01)

(52) U.S. Cl.
CPC ............ *G06F 30/34* (2020.01); *G06F 30/327* (2020.01); *G06F 30/3312* (2020.01); *G06F 30/392* (2020.01)

(58) Field of Classification Search
USPC ....................................................... 716/117
See application file for complete search history.

(56) References Cited

U.S. PATENT DOCUMENTS

| | | | |
|---|---|---|---|
| 2021/0406438 A1* | 12/2021 | Jain ..................... | G06F 30/3312 |
| 2022/0121799 A1* | 4/2022 | Bhattacharya ........ | G06F 30/367 |
| 2022/0198116 A1* | 6/2022 | Zhang ................... | G06F 30/392 |
| 2023/0051243 A1* | 2/2023 | Sanchez ............... | G09B 19/167 |

* cited by examiner

*Primary Examiner* — Mohammed Alam
(74) *Attorney, Agent, or Firm* — Bayramoglu Law Offices LLC

(57) ABSTRACT

A method for logic design partitioning includes: collecting an RTL design file used for describing a logic circuit; performing syntax analysis processing on the RTL design file; extracting an always object and an assign object from logic model objects, and encapsulating the always object and the assign object, respectively; constructing and generating a hypergraph-based data structure; performing attribute analysis, and obtaining operating frequency information by processing according to clock domain information; associating and storing the clock domain information and the operating frequency information with corresponding nodes; and performing partitioning processing to obtain corresponding partitioned data. By means of the solutions of the present invention, other processing at the back end of the flow is not affected, the partitioning time is reduced and the partitioning efficiency is improved. Meanwhile, the logic content in chip design is partitioned efficiently, reasonably and correctly.

10 Claims, 5 Drawing Sheets

```
module dut (
   input clk,
   input [7:0] a,
   input [7:0] b,
   output [31:0] c
);

reg [7:0] a_d, a_q, b_d, b_q;
   reg [31:0] c_d, c_q, c_t;

assign c = c_t;

always @(*) begin
     a_d = a;
     b_d = b;
     c_d = (a_q * a_q) * (b_q * b_q) ;
   end always @(posedge clk) begin
     a_q <= a_d;
     b_q <= b_d;
     c_q <= c_d;
   end assign c_t = c_q*(c_q+0xffe05332);

endmodule
```

FIG. 3

```
module pm_1 (
   input [31:0] c_ct,
   output [31:0] c
);
```

FIG. 4A

```
module pm_3 (
   input clk,
   input [7:0] a_d,
   input [7:0] b_d,
   input [31:0] c_d,
   output [7:0] a_q,
   output [7:0] b_q,
   output [31:0] c_q
);
```

FIG. 4B

```
module pm_2 (
   input [7:0] a,
   input [7:0] b,
   input [7:0] a_q,
   input [7:0] b_q,
   output [7:0] a_d,
   output [7:0] b_d,
   output [31:0] c_d,
);
```

FIG. 4C

```
module pm_4 (
    input [31:0] c_q,
    output [31:0] c_t
);
```

```
module dut (
    input clk,
    input [7:0] a,
    input [7:0] b,
    output [31:0] c
);

wire [7:0] a_d, a_q, b_d, b_q;
wire [31:0] c_d, c_q, c_t;

pm_1 pm_1(c_t,c);
pm_2 pm_2(a,b,a_q,b_q,a_d,b_d,c_d);
pm_3 pm_3(clk,a_d,b_d,c_d,a_q,b_q,c_q);
pm_4 pm_4(c_t,c_q);

endmodule
```

METHOD AND SYSTEM FOR LOGIC DESIGN PARTITIONING

CROSS REFERENCE TO THE RELATED APPLICATIONS

This application is based upon and claims priority to Chinese Patent Application No. 202011513538.4, filed on Dec. 21, 2020, the entire contents of which are incorporated herein by reference.

TECHNICAL FIELD

The present invention relates to the technical field of verification of field-programmable gate array (FPGA) prototyping systems, and in particular to a method and a system for logic design partitioning.

BACKGROUND

With the continuous improvement of chip integration and circuit complexity, the logic scale of current mainstream digital chips, which mainly include massive intellectual property (IP) cores, central processing unit (CPU) cores, firmware codes, microcontroller microcode and embedded software, can easily reach hundreds of millions, billions or even tens of billions of gates. The growth in the logic scale of FPGAs imposes higher requirements for functional verification. An efficient, reasonable method for design partitioning can greatly improve the performance and efficiency of design partitioning, thereby accelerating the progress of user front-end functional verification and the development of integrated circuit products.

In the prior art, partitioning tools based on graph theory algorithms for FPGA prototyping systems mostly work on the netlist level of a gate-level circuit, and after obtaining a netlist of the gate-level circuit of the chip, perform hypergraph modeling based on the netlist. The partitioning using the partitioning tools based on traditional graph theory algorithms tends to be relatively back-end processing in the entire chip or integrated circuit (IC) design flow. As a result, a large number of graph nodes need to be processed, which involves a time-consuming flow where the tuning on the partitioning and the iteration cycle are very long, thereby seriously affecting the design and development cycle of the chip. Moreover, during the processing flow of the traditional partitioning method, the absence or lack of timing-related information in the circuit frequently leads to the fact that the circuit structure of the partitioning result is unreasonable, the operating performance is degraded, or the logic function cannot operate correctly.

SUMMARY

In view of the above, an embodiment of the present invention provides a method and a system for logic design partitioning to at least partially solve the problems in the prior art.

The present invention specifically adopts the following technical solutions.

A method for logic design partitioning applied to the verification of an FPGA prototyping system includes:
step S1, collecting, at a front end of a chip design flow, a register-transfer level (RTL) design file used for describing a logic circuit;
step S2, performing syntax analysis processing on the RTL design file to obtain a plurality of logic model objects and logic interconnection relationships between the logic model objects;
step S3, extracting an always object and an assign object from the logic model objects, and encapsulating and converting the always object and the assign object into a module object, respectively, wherein the always object is encapsulated and converted into a timing module object;
step S4, using the logic model objects as nodes, and constructing and generating a hypergraph-based data structure according to the logic interconnection relationships;
step S5, performing attribute analysis on a node composed of the timing module object in the hypergraph-based data structure to obtain clock domain information, and obtaining operating frequency information by processing according to the clock domain information;
step S6, associating and storing the clock domain information and the operating frequency information with corresponding nodes; and
step S7, performing partitioning processing on the hypergraph-based data structure by using a timing-driven advanced partitioning algorithm, to obtain corresponding partitioned data.

Preferably, in step S5, the operating frequency information is obtained by processing according to the clock domain information and a constraint condition in the RTL design file.

Preferably, the clock domain information includes a name of a driving clock and a register driving mode.

Preferably, in step S3, the assign object is encapsulated and converted into a combinational module object.

Preferably, in step S2, the logic model objects and the logic interconnection relationships are obtained by performing syntax analysis and semantic decomposition on the RTL design file.

A system for logic design partitioning applied to the verification of an FPGA prototyping system includes:
a collection module, wherein the collection module is configured for collecting, at a front end of a chip design flow, an RTL design file used for describing a logic circuit;
a processing module, wherein the processing module is connected to the collection module, and is configured for performing syntax analysis processing on the RTL design file to obtain a plurality of logic model objects and logic interconnection relationships between the logic model objects;
an extraction module, wherein the extraction module is connected to the processing module, and is configured for extracting an always object and an assign object from the logic model objects;
a conversion module, wherein the conversion module is connected to the extraction module, and is configured for converting the always object and the assign object into a module object, respectively, wherein the always object is encapsulated and converted into a timing module object;
a construction module, wherein the construction module is connected to the conversion module and the processing module, and is configured for using the logic model objects as nodes, and constructing and generating a hypergraph-based data structure according to the logic interconnection relationships;

an analysis module, wherein the analysis module is connected to the construction module, and is configured for performing attribute analysis on a node composed of the timing module object in the hypergraph-based data structure to obtain clock domain information, and obtaining operating frequency information by processing according to the clock domain information;

an association module, wherein the association module is connected to the analysis module and the construction module, and is configured for associating and storing the clock domain information and the operating frequency information with corresponding nodes; and a partitioning module, wherein the partitioning module is connected to the association module and the construction module, and is configured for performing partitioning processing on the hypergraph-based data structure by using a timing-driven advanced partitioning algorithm, to obtain corresponding partitioned data.

Preferably, the operating frequency information is obtained by processing according to the clock domain information and a constraint condition in the RTL design file.

Preferably, the clock domain information includes a name of a driving clock and a register driving mode.

Preferably, the conversion module encapsulates and converts the assign object into a combinational module object.

Preferably, the processing module obtains the logic model objects and the logic interconnection relationships by performing syntax analysis and semantic decomposition on the RTL design file.

The advantages of the above technical solutions are as follows.

Through hypergraph data modeling of the RTL design file at the front end of the chip design flow, the logic content of the chip is converted into a hypergraph set containing the weights of module nodes and the weights of network connection wires. The design logic content is partitioned at the front end of the chip design flow, so as not to affect other processing at the back end of the flow, which reduces the partitioning time and improves the partitioning efficiency. Meanwhile, during the hypergraph data modeling, the logic-related clock domain information and operating frequency information in the RTL design file are dynamically parsed and stored in the data structure. In combination with the graph theory partitioning algorithm and theory that are commonly used in the art, the logic content in the chip design is partitioned efficiently, reasonably and correctly, which greatly improves the performance and efficiency of design partitioning, thereby accelerating the progress of user front-end functional verification and the development of integrated circuit products.

BRIEF DESCRIPTION OF THE DRAWINGS

In order to explain the technical solutions of the embodiments of the present invention more clearly, the drawings used in the embodiments will be briefly introduced below. Obviously, the drawings in the following description are only some embodiments of the present invention. For those of ordinary skill in the art, other drawings can be obtained from these drawings without creative efforts.

FIG. 3 shows a code example of an RTL design file;

FIGS. 4A-4D show code examples of the logic model objects obtained after processing and converting the RTL design file;

FIG. 5 shows a code example of the file obtained after reconstructing the RTL design file; and FIG. 6 shows an example of the generated hypergraph-based data structure.

DETAILED DESCRIPTION OF THE EMBODIMENTS

The embodiments of the present invention will be described in detail below in combination with the drawings.

Hereinafter, the embodiments of the present invention will be explained by the specific examples below, and those skilled in the art can easily understand other advantages and effects of the present invention from the contents disclosed in this specification. Obviously, the described embodiments are only a part of the embodiments of the present invention, rather than all the embodiments. The present invention can also be implemented or applied through other different specific embodiments, and various details in this specification can also be modified or changed based on different viewpoints and applications without departing from the spirit of the present invention. It should be noted that, in case of no conflict, the following embodiments and the features in the embodiments can be combined with each other. Based on the embodiments in the present invention, all other embodiments obtained by those of ordinary skill in the art without creative efforts shall fall within the scope of protection of the present invention.

It should be noted that various aspects of the embodiments within the scope of the appended claims are described below. It is obvious that the aspects described herein can be embodied in a wide variety of forms, and any specific structure and/or function described herein are only illustrative. Based on the present invention, those skilled in the art should understand that one aspect described herein can be implemented independently of any other aspects, and two or more of these aspects can be combined in various ways. For example, any number of aspects set forth herein can be used to implement a device and/or practice a method. In addition, structures and/or functions other than one or more of the aspects set forth herein may be used to implement this device and/or practice this method.

It should also be noted that the illustrations provided in the following embodiments only illustrate the basic idea of the present invention in a schematic manner. The drawings only show the components related to the present invention instead of being drawn according to the number, shape, and size of the components in actual implementation. The type, number, and proportion of the components in actual implementation can be changed optionally, and the component layout may also be more complicated.

In addition, in the following description, specific details are provided to facilitate a thorough understanding of the examples. However, those skilled in the art will understand that the aspects can be practiced without these specific details.

Figure 1:
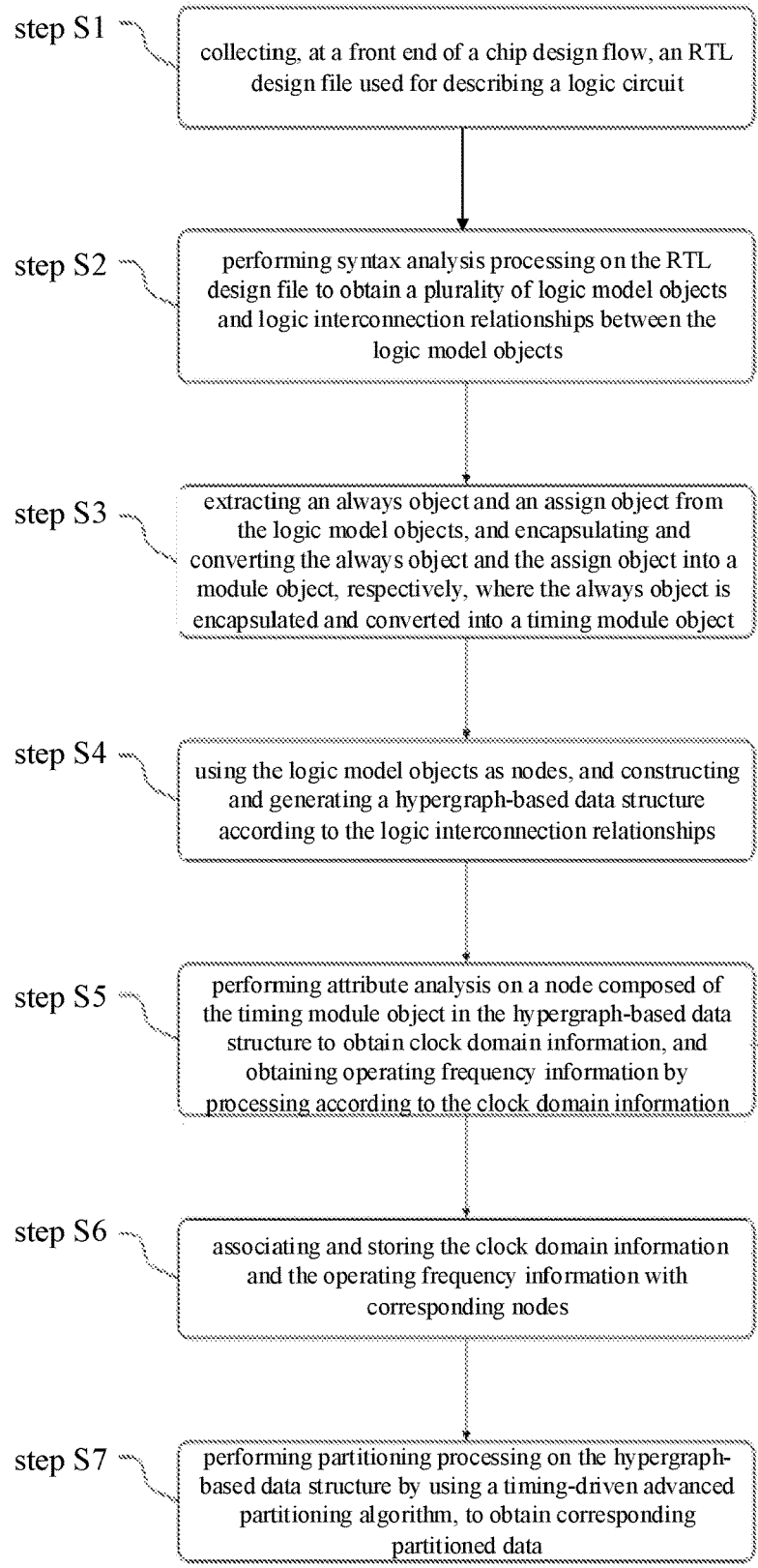
FIG. 1 is a flow chart of a method for logic design partitioning according to a preferred embodiment of the present invention.

As shown in FIG. 1, a method for logic design partitioning applied to the verification of an FPGA prototyping system includes:

Step S1, at the front end of a chip design flow, a register-transfer level (RTL) design file used for describing a logic circuit is collected.

In integrated circuit design, the RTL is an abstraction used for describing the operation of a synchronous digital circuit. At the RTL, the chip is composed of a set of registers and logic operations between the registers. This is because most circuits can be regarded as storing binary data by registers and completing data processing by logic operations between the registers. The flow of data processing is controlled by a sequential state machine, and the processing and control can be described by using a hardware description language.

As an abstract logic behavior description language, the RTL design language mainly uses fewer functional modules and state machine changes (always, assign assignment) to describe the transmission and processing of signals in the chip. Performed based on the modules and a state machine assignment module (always, assign), the modeling process processes a small amount of data, and thus can generally be completed in a short time. In this way, the design logic content is partitioned at the front end of the chip or IC design flow, without affecting other processing at the back end of the flow. Meanwhile, during the hypergraph data modeling, the logic-related clock domain and timing information in the RTL design language are dynamically parsed and stored in the data structure for the hypergraph partitioning algorithms or tools that are commonly used in the art to read, thereby generating a correct partitioning result with a reasonable circuit structure layout and higher operating performance.

Step S2, syntax analysis processing is performed on the RTL design file to obtain a plurality of logic model objects and logic interconnection relationships between the logic model objects.

In a preferred embodiment of the present invention, in step S2, each logic model object and the logic interconnection relationships are obtained by performing syntax analysis and semantic decomposition on the RTL design file. The logic model objects include one or more of a module object, an assign object, and an always object. The logic interconnection relationships are presented in the form of a complete object parse tree with hierarchies. The logic interconnection relationships contain all the logic content described in the RTL design file. As shown in FIG. 3, FIG. 3 shows part of the code example in the RTL design file. From the code content, it can be seen that the RTL design file simultaneously includes the module object, the assign object, and the always object.

Step S3, an always object and an assign object are extracted from the logic model objects, and the always object and the assign object are encapsulated and converted into a module object, respectively, wherein the always object is encapsulated and converted into a timing module object.

Figures 4D, 5, 6:
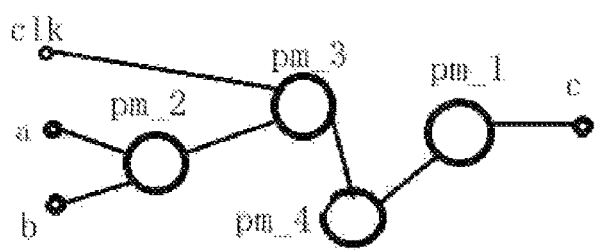

In a preferred embodiment of the present invention, the parsed logic model objects include multiple styles, such as a module object, an assign object, and an always object. In step S3, the assign object is encapsulated and converted into a combinational module object, and the always object is encapsulated and converted into a timing module object. Namely, all other objects in the logic model objects extracted in step S2 are converted into a unified module object to facilitate subsequent unified modeling processing. As shown in FIGS. 4A-4B, after analysis processing is performed on the RTL design file, multiple logic model objects are generated, and then the always object and the assign object are extracted from the logic model objects, and are encapsulated and converted into a module object, respectively, so that all the logic model objects are module objects pm_1, pm_2, pm_3, and pm_4, as shown in FIG. 5. The RTL design file is reconstructed according to the converted logic model objects.

Step S4, the logic model objects are used as nodes, and a hypergraph-based data structure is constructed and generated according to the logic interconnection relationships.

Specifically, in this embodiment, as shown in FIG. 6, the hypergraph data modeling is performed on the logic model objects that are converted into module objects in a unified manner. Each logic model object is used as a node, and the parsed logic interconnection relationships are used as connection wires between the nodes, so as to construct and generate the hypergraph-based data structure. Finally, the RTL design file is converted into an interconnection relationship graph composed of many nodes and connection wires between the nodes, that is, the hypergraph-based data structure that is commonly used in the art.

Step S5, attribute analysis is performed on a node composed of the timing module object in the hypergraph-based data structure to obtain clock domain information, and operating frequency information is obtained by processing according to the clock domain information.

In a preferred embodiment of the present invention, in step S5, the operating frequency information is obtained by processing according to the clock domain information and a constraint condition in the RTL design file. In a specific embodiment of the present invention, the clock domain information includes a name of a driving clock, a register driving mode and the like. Subsequently, the operating frequency information is obtained by further analysis in combination with the constraint condition of the RTL design language.

Step S6, the clock domain information and the operating frequency information are associated with corresponding nodes and stored.

Step S7, partitioning processing is performed on the hypergraph-based data structure by using a timing-driven advanced partitioning algorithm, to obtain corresponding partitioned data.

After being obtained, the clock domain information and the operating frequency information of the node, as timing information, are defined and stored in a weight resource list of the corresponding node and connection wire in a unified manner. Since temporal properties such as the clock domain information and the operating frequency information of the corresponding logic circuit are added to the hypergraph-based data structure, for some timing-driven advanced partitioning algorithms, such as the Lagrange algorithm and the multiple time-division multiplexing ratio algorithm, such timing information can be used to perform partitioning processing on the hypergraph-based data structure based on a more reasonable circuit structure and more efficient performance, so as to achieve better partitioning effect and expected performance.

The specific embodiments of this specification have been described above. Other embodiments are within the scope of the appended claims. In some cases, the operations or steps described in the claims can be performed in a different order from that in the embodiments to achieve the desired results. In addition, the processes depicted in the drawings do not necessarily require the specific order or sequential order shown in order to achieve the desired results. In some embodiments, multitasking and parallel processing are also feasible or may be advantageous.

Figure 2:
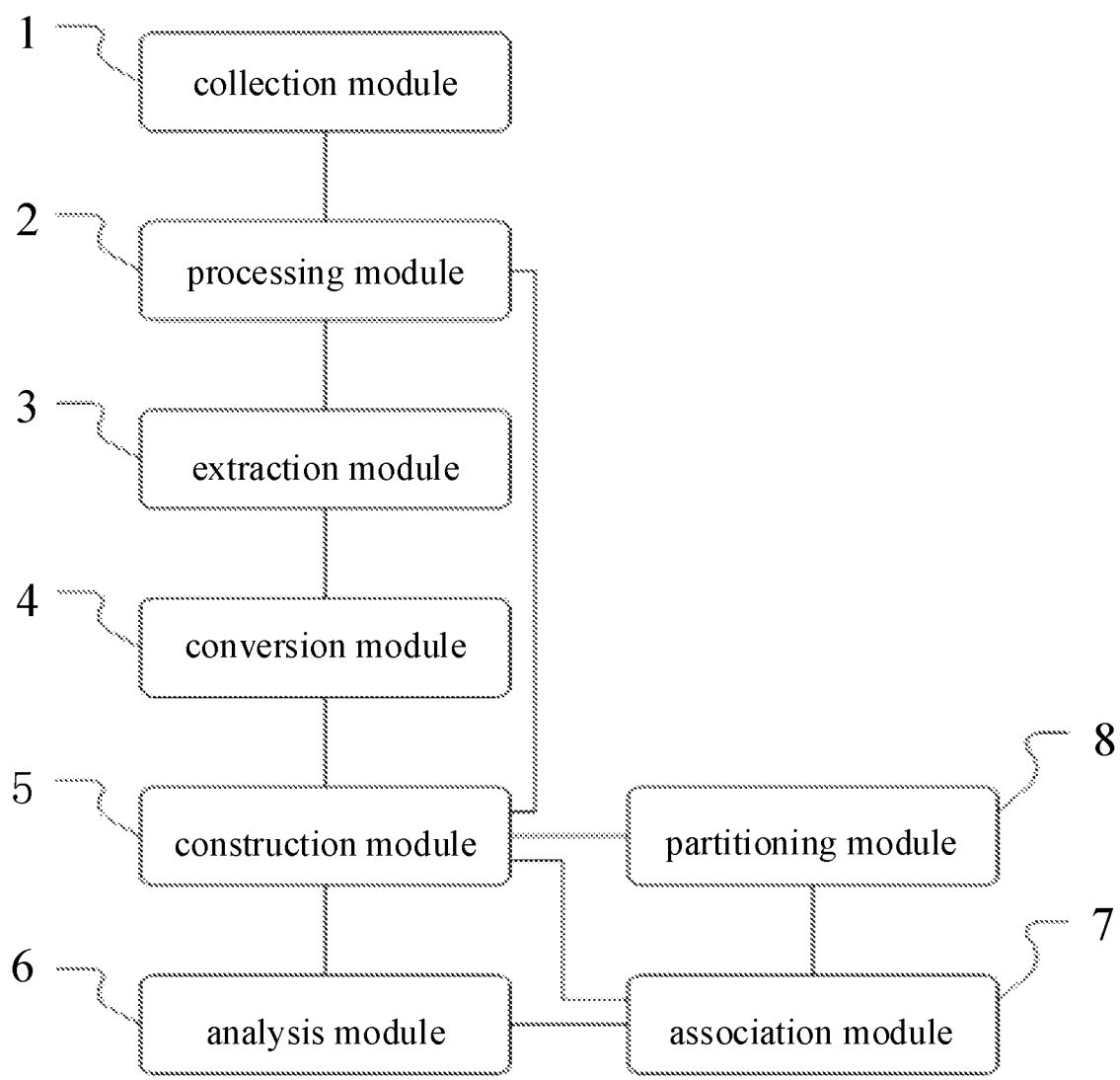
FIG. 2 is a schematic diagram of the structure of a system for logic design partitioning according to a preferred embodiment of the present invention.

As shown in FIG. 2, a system for logic design partitioning applied to the verification of an FPGA prototyping system includes:

the collection module 1, wherein the collection module 1 is configured for collecting, at the front end of a chip design flow, an RTL design file used for describing a logic circuit;

the processing module 2, wherein the processing module 2 is connected to the collection module 1, and is configured for performing syntax analysis processing on the RTL design file to obtain a plurality of logic model objects and logic interconnection relationships between the logic model objects;

the extraction module 3, wherein the extraction module 3 is connected to the processing module 2, and is configured for extracting an always object and an assign object from the logic model objects;

the conversion module 4, wherein the conversion module 4 is connected to the extraction module 3, and is configured for converting the always object and the assign object into a module object, respectively, wherein the always object is encapsulated and converted into a timing module object;

the construction module 5, wherein the construction module 5 is connected to the conversion module 4 and the processing module 2, and is configured for using the logic model objects as nodes, and constructing and generating a hypergraph-based data structure according to the logic interconnection relationships;

the analysis module 6, wherein the analysis module 6 is connected to the construction module 5, and is configured for performing attribute analysis on a node composed of the timing module object in the hypergraph-based data structure to obtain clock domain information, and obtaining operating frequency information by processing according to the clock domain information;

the association module 7, wherein the association module 7 is connected to the analysis module 6 and the construction module 5, and is configured for associating and storing the clock domain information and the operating frequency information with corresponding nodes; and the partitioning module 8, wherein the partitioning module 8 is connected to the association module 7 and the construction module 5, and is configured for performing partitioning processing on the hypergraph-based data structure by using a timing-driven advanced partitioning algorithm, to obtain corresponding partitioned data.

In a preferred embodiment of the present invention, the operating frequency information is obtained by processing according to the clock domain information and a constraint condition in the RTL design file.

In a preferred embodiment of the present invention, the clock domain information includes a name of a driving clock and a register driving mode.

In a preferred embodiment of the present invention, the conversion module 4 encapsulates and converts the assign object into a combinational module object.

In a preferred embodiment of the present invention, the processing module 2 obtains the logic model objects and the logic interconnection relationships by performing syntax analysis and semantic decomposition on the RTL design file.

The advantages of the above technical solutions are as follows:

Through hypergraph data modeling of the RTL design file at the front end of the chip design flow, the logic content of the chip is converted into a hypergraph set containing the weights of module nodes and the weights of network connection wires, and the design logic content is partitioned at the front end of the chip design flow, so as not to affect other processing at the back end of the flow, which reduces the partitioning time and improves the partitioning efficiency. Meanwhile, during the hypergraph data modeling, the logic-related clock domain information and operating frequency information in the RTL design file are dynamically parsed and stored in the data structure for the timing-driven advanced partitioning algorithm to read, so that the circuit structure layout generated by partitioning is more reasonable and has higher operating performance.

The above contents are only the specific embodiments of the present invention, but the scope of protection of the present invention is not limited to thereto. Modifications or substitutions that are easily conceived by any person skilled in the art within the technical scope disclosed in the present invention shall fall within the scope of protection of the present invention. Therefore, the scope of protection of the present invention shall be subject to the scope of protection of the claims.

What is claimed is:

1. A method for logic design partitioning for a verification of a field-programmable gate array (FPGA) prototyping system, comprising:

step S1, collecting, at a front end of a chip design flow, a register-transfer level (RTL) design file used for describing a logic circuit;

step S2, performing syntax analysis processing on the RTL design file to obtain a plurality of logic model objects and logic interconnection relationships between the plurality of logic model objects;

step S3, extracting an always object and an assign object from the plurality of logic model objects, and encapsulating and converting the always object and the assign object into a module object, respectively, wherein the always object is encapsulated and converted into a timing module object;

step S4, using the plurality of logic model objects as nodes, and constructing and generating a hypergraph-based data structure according to the logic interconnection relationships;

step S5, performing an attribute analysis on a node composed of the timing module object in the hypergraph-based data structure to obtain clock domain information, and obtaining operating frequency information by processing according to the clock domain information;

step S6, associating and storing the clock domain information and the operating frequency information with nodes corresponding to the clock domain information and the operating frequency information; and step S7, performing partitioning processing on the hypergraph-based data structure by using a timing-driven advanced partitioning algorithm, to obtain partitioned data corresponding to the hypergraph-based data structure.

2. The method according to claim 1, wherein
in step S5, the operating frequency information is obtained by processing according to the clock domain information and a constraint condition in the RTL design file.

3. The method according to claim 1, wherein
the clock domain information comprises a name of a driving clock and a register driving mode.

4. The method according to claim 1, wherein
in step S3, the assign object is encapsulated and converted into a combinational module object.

5. The method according to claim 1, wherein
in step S2, the plurality of logic model objects and the logic interconnection relationships are obtained by performing a syntax analysis and a semantic decomposition on the RTL design file.

6. A system for logic design partitioning for a verification of an FPGA prototyping system, comprising:
- a collection module, wherein the collection module is configured for collecting, at a front end of a chip design flow, an RTL design file used for describing a logic circuit;
- a processing module, wherein the processing module is connected to the collection module, and the processing module is configured for performing syntax analysis processing on the RTL design file to obtain a plurality of logic model objects and logic interconnection relationships between the plurality of logic model objects;
- an extraction module, wherein the extraction module is connected to the processing module, and the extraction module is configured for extracting an always object and an assign object from the plurality of logic model objects;
- a conversion module, wherein the conversion module is connected to the extraction module, and the conversion module is configured for converting the always object and the assign object into a module object, respectively, wherein the always object is encapsulated and converted into a timing module object;
- a construction module, wherein the construction module is connected to the conversion module and the processing module, and the construction module is configured for using the plurality of logic model objects as nodes, and constructing and generating a hypergraph-based data structure according to the logic interconnection relationships;
- an analysis module, wherein the analysis module is connected to the construction module, and the analysis module is configured for performing an attribute analysis on a node composed of the timing module object in the hypergraph-based data structure to obtain clock domain information, and obtaining operating frequency information by processing according to the clock domain information;
- an association module, wherein the association module is connected to the analysis module and the construction module, and the association module is configured for associating and storing the clock domain information and the operating frequency information with nodes corresponding to the clock domain information and the operating frequency information; and
- a partitioning module, wherein the partitioning module is connected to the association module and the construction module, and the partitioning module is configured for performing partitioning processing on the hypergraph-based data structure by using a timing-driven advanced partitioning algorithm, to obtain partitioned data corresponding to the hypergraph-based data structure.

7. The system according to claim 6, wherein
the operating frequency information is obtained by processing according to the clock domain information and a constraint condition in the RTL design file.

8. The system according to claim 6, wherein
the clock domain information comprises a name of a driving clock and a register driving mode.

9. The system according to claim 6, wherein
the conversion module encapsulates and converts the assign object into a combinational module object.

10. The system according to claim 6, wherein
the processing module obtains the plurality of logic model objects and the logic interconnection relationships by performing a syntax analysis and a semantic decomposition on the RTL design file.

* * * * *